United States Patent [19]

Dran et al.

[11] 4,321,418
[45] Mar. 23, 1982

[54] PROCESS FOR MANUFACTURE OF SOLAR PHOTOCELL PANELS AND PANELS OBTAINED THEREBY

[75] Inventors: Maurice Dran, Paris; Daniel Dages, Les Mureaux; Serge Le Gravier, Orleans, all of France

[73] Assignee: Saint Gobain Vitrage, Neuilly-sur-Seine, France

[21] Appl. No.: 147,921

[22] Filed: May 8, 1980

[30] Foreign Application Priority Data

May 8, 1979 [FR] France .................... 79 11631
Mar. 25, 1980 [FR] France .................... 80 06568

[51] Int. Cl.³ .................. H01L 31/04; H01L 31/18; B29G 6/00
[52] U.S. Cl. .................. 136/251; 264/102; 264/126; 264/272.14
[58] Field of Search .................. 264/102, 272, 126; 136/89, 251

[56] References Cited

U.S. PATENT DOCUMENTS

| | | | |
|---|---|---|---|
| 2,611,930 | 9/1952 | Hill et al. ........................ | 264/102 |
| 3,653,970 | 4/1972 | Iles .................................. | 136/89 |
| 3,912,540 | 10/1975 | Broder ............................ | 136/89 |
| 4,057,439 | 11/1977 | Lindmayer ..................... | 136/89 |
| 4,067,764 | 1/1978 | Walker et al. .................. | 136/89 H |
| 4,083,097 | 4/1978 | Anagnostou et al. .......... | 136/89 H |
| 4,116,207 | 9/1978 | Dominguez ..................... | 136/89 H |
| 4,210,462 | 7/1980 | Tourneux ........................ | 136/89 EP |
| 4,224,081 | 9/1980 | Kawamura ..................... | 136/251 |

FOREIGN PATENT DOCUMENTS

2000371 1/1979 United Kingdom .

*Primary Examiner*—James R. Hall
*Attorney, Agent, or Firm*—Pennie & Edmonds

[57] ABSTRACT

A panel of a plurality of electrically connected photocells wherein each photocell has a lower face, a side face and a radiation receiving face, is produced by (a) embedding at least the lower faces and side faces of the photocells and their electrical connectors in a thermoplastic resin in particulate form which resin becomes transparent upon fusion; (b) enclosing the photocells embedded in step (a) between two rigid sheets to form a sandwich-type assembly, with at least the rigid sheet enclosing the receiving faces of the photocells being optically transparent; (c) disposing the stacked assembly formed in step (b) within a flexible bag; (d) subjecting the interior of the flexible bag to a vacuum while applying relatively high pressure to the outside of the bag, and raising the temperature within the bag to fuse the thermoplastic resin particles; and (e) cooling the contents of the bag to solidify the resin and form thereby the panel comprising the photocells adhesively embedded in the solidified resin between the rigid sheets, and restoring atmospheric pressure to the interior of the bag.

11 Claims, 5 Drawing Figures

PROCESS FOR MANUFACTURE OF SOLAR PHOTOCELL PANELS AND PANELS OBTAINED THEREBY

BACKGROUND OF THE INVENTION

This invention relates to a method for making solar photocell panels useful in forming photoelectric batteries. Such panels comprise a plurality of photocells connected together electrically and having electrical output terminals or connectors. The photocells and their associated electrical connectors are embedded in at least one layer of plastic between two rigid sheets of which at least the sheet on the side of the receiving face of the photocells is transparent.

Solar photocells have as their main application the supplying of electrical energy to devices such as light beacons, land or maritime radio beacons, television retransmitters in mountainous areas, and the like.

In general, electrically interconnected solar photocells are arranged in batteries in the form of panels which are easy to mount and use. It is very important that a panel retain its structural, photovoltaic and electrical qualities over long periods of time. These objectives require that the surface elements of the photocell, such as silicon semiconductors, remain stable, which in turn requires that the photocells be protected from the atmosphere. Therefore, the panel must remain impervious to air and moisture, otherwise the output of the photocells will drop, because in practice, their useful lifetime is a function of the effectiveness with which they have been encapsulated.

On the other hand, in order to achieve a practical degree of electric power output, the panels must have sufficiently large dimensions. However, the cost of such panels is high since it depends on the cost of the semiconductors used, the cost of the mechanical support systems, and the amount of labor needed to make the panels, considering the care that must go into them.

Some types of solar panels have already appeared on the market. Unfortunately, it is very difficult to provide such panels that are free of bubbles or other defects using only two thermoplastic sheets of polyvinylbutyral, which is the most widely used resin for making laminated glass. For this reason, some panels have been made by placing a battery of interconnected photocells between two sheets of glass, and filling the spaces between the sheets and the photocells with a transparent resin in the form of a syrup that later solidifies, e.g., by polymerization. But panels prepared by this technique can have defects in homogeneity or bubbles that are introduced at the time the resin is injected, and such panels are considered unusable. Furthermore, this fabrication technique requires considerable care and time which of course increases the cost per installed solar watt.

DISCLOSURE OF INVENTION

The present invention provides a process for producing solar photocell panels, said process comprising at least partially encasing one or more photelectric or photovoltaic cells and their electrical connections, preferably on their lower faces and side faces, in a thermoplastic or plasticized thermoplastic resin in a particulate form, possibly an agglomerated or sintered powder. The photocells and their connectors thus encased are enclosed between two preferably rigid sheets, and the resin is then fused or melted in situ to cause adherence between the photocells and the rigid sheets.

There is thus obtained a panel free of bubbles and other undesirable heterogeneities. Fluid tightness of the panel is assured by using a sufficiently wide protective strip of thermoplastic resin or by use of a peripheral joint molded from another material. Of course, any thermoplastic resin that is used must become transparent after fusion.

To perform the fusion step, the sandwich, made up of the two rigid sheets containing between them the network of photocells encased in the granular thermoplastic resin, is inserted into a flexible bag within which a vacuum is then applied in order to eliminate trapped air, while at the same time applying a relatively high pressure to the outside of the bag placed in an autoclave, the temperature and pressure of the autoclave being progressively increased until softening and fusion of the thermoplastic resin powder occurs, followed by progressive cooling. The autoclave is then decompressed and the vacuum is released.

A variant of the process of the invention using a fritted preform makes it possible to operate with better precision and particularly to avoid random variations in the thickness of the layer of thermoplastic resin powder that can occur at the time of filling, variations that can entail unsticking or breaking of the rigid sheets or deterioration of the network. This variant involves pouring thermoplastic resin powder into a preforming mold exhibiting reliefs intended to reproduce the imprints of the solar photocells, smoothing the upper surface, heating the mold thus filled to the fritting or sintering temperature of the powder, removing the fritted preform from the mold, placing it on one of the rigid sheets with the imprints turned upwardly, introducing the interconnected photocell network in the imprints, covering this assembly with the second rigid sheet and subjecting the resulting panel to a heat treatment under vacuum to eliminate entrapped air and effect sticking or adhesion of the performed powder to the rigid sheets. The advantage of this embodiment lies in the fact that fritting which does not modify the thickness of the preform results in regular ranges for the cells and for the upper panel.

BRIEF DESCRIPTION OF THE DRAWINGS

The invention will now be described in detail in connection with several preferred embodiments given by way of non-limiting examples and with reference to the accompanying drawings, wherein.

BEST MODE FOR CARRYING OUT THE INVENTION

Figure 1:
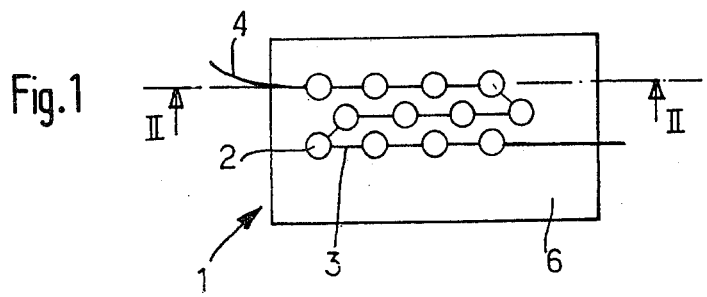
FIG. 1 is a top view of the panel of photocells obtained in the process according to the invention.
Figure 2:
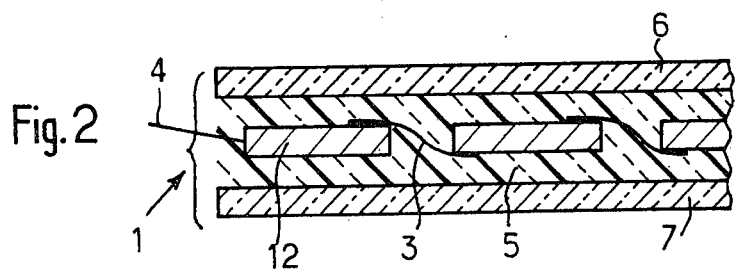
FIG. 2 is an enlarged schematic section taken long line II—II of FIG. 1.

FIGS. 1 and 2 show a panel 1 in the finished state as made by the process according to the invention. Panel 1 is made up of elementary or individual photocells 2 electrically interconnected by conductive strips 3 and comprising at least two such connections 4 for connection with the outside.

According to the process of the invention which will be described hereinbelow, photocells 2 are buried in a layer 5 of transparent plastic. Layer 5 is disposed between two rigid fluid-tight sheets 6 and 7, of which at least one, sheet 6, is made of transparent material, for example, of glass, plastic or transparent vitrocrystalline. Advantageously the two sheets are made of glass.

Figure 3:
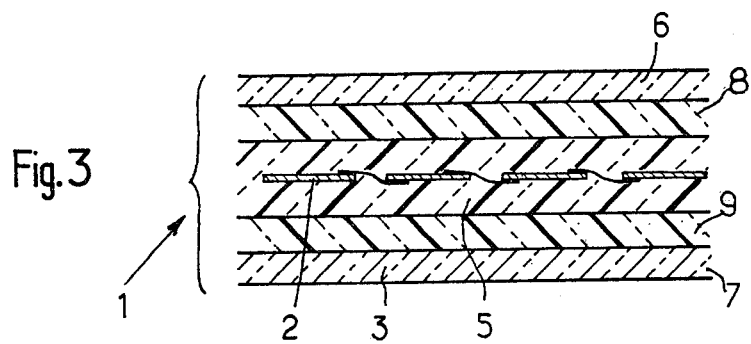
FIG. 3 is an alternative embodiment of the panel made according to the invention.

FIG. 3 depicts a variant embodiment of the panel made by the process according to the invention. This variant process consists in enclosing layer 5 between two flexible thermoplastic sheets 8 and 9 that can be fused respectively to the constitutive material of layer 5 and rigid sheets 6 and 7. Sheets 8 and 9 can advantageously be made of the same material as layer 5.

A synthetic resin such as plasticized polyvinylbutyral is preferred as the thermoplastic material for layer 5. Such a resin is described in the publication of French Pat. No. 2,401,941.

Generally, the plasticizers used are esters insoluble in water, of acids with several carboxyl groups or of alcohols with several hydroxyl groups. Suitable plasticizers include, for example, and not by way of limitation, derivatives of polyethylene glycols such as triethylene di-(ethyl-2-butyrate), triethylene dipelargonate, adipates such as dihexyl adipate, dibutoxyethyladipate, alkyl and aryl adipates such as those mentioned in French Patent Application No. 78 32737, filed Nov. 21, 1978 in the name of the applicant, dibutyl sebacate and the like. Other plasticizers suitable for use with the polyvinylbutyral will be apparent to those skilled in the art having the benefit of the present disclosure before them.

The solar cells suitable for use in the present invention can be monocrystalline or polycrystalline silicon, cadmium telluride, cadmium sulfide, poly- or monocrystalline gallium arsenide, indium phosphide, and the like. The connecting and output strips can, for example, be tinned copper, silver, aluminum, alloys thereof or any other metal or material exhibiting a good electrical conductivity. Fluid-tight panels are made according to the invention by using two 3 mm thick glass sheets, polyvinylbutyral resin as described in aforesaid French Pat. No. 2,401,941, a plasticizer and silicon photocells in the form of discs 0.3 mm thick and 57 mm in diameter. The connectors are of tinned copper.

The process for making photocell panels according to the invention will now be described with the following examples.

EXAMPLE 1

On a sheet of glass kept horizontal, there is screen-distributed a uniform layer of a mixture of 100 parts by weight of polyvinylbutyral resin powder and 41 parts by weight of powdered plasticizer made up of triethyleneglycol di-(ethyl-2-butyrate). This mixture had been previously prepared by a planetary mixer, of the kneader type, at ambient temperature.

Figure 4:
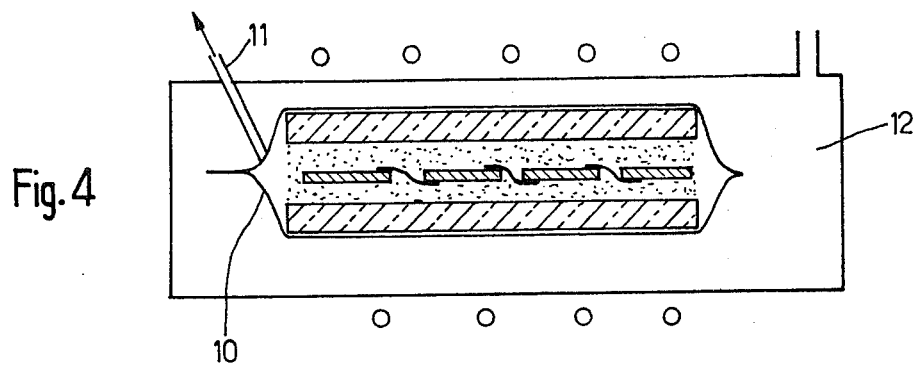
FIG. 4 shows a phase of the embodiment of the panel by the process according to the invention.

The apparent volumetric mass of the mixture is 0.2 g/cm$^3$. The thickness of the layer of plasticized resin deposited on the glass sheet is 5 mm. The interconnected cells are placed on the layer of plasticized powder with a pneumatic pick-up system comprising a sucking disk for each cell. A further layer of the plasticized resin, 5 mm thick, is then distributed on the previous layer as uniformly as possible. A 3 mm glass sheet is placed on the last layer. The resulting sandwich is then slid into a flexible bag 10 (see FIG. 4), for example of rubber, in which a vacuum can be applied with pipe 11 connected to a vacuum pump (not shown) to eliminate trapped gases. The bag is placed in an autoclave 12. The vacuum is applied in the bag at ambient temperature for about half an hour, then a relatively high pressure of 2 bars is applied on the outside of the bag by admitting compressed air into the autoclave, while maintaining the vacuum in the bag. The temperature is then progressively increased in the autoclave at a rate of about 4° C./minute. When the temperature reaches 100° C., the pressure applied to the outside of the bag is brought to 10 bars in 5 minutes. The temperature is then brought to 140° C. The unit is kept under 10 bars and 140° C. for 30 minutes, at then end of which time the unit is progressively cooled under pressure. The autoclave is decompressed, the vacuum is broken and the panel recovered. The transparent solar photocell panel does not exhibit any visible bubbles or heterogeneities.

EXAMPLE 2

A panel similar to that of Example 1 is made with a plasticizer having a triethylene glycol di-(ethyl-2-butyrate) content of 20 parts by weight per 100 parts by weight of resin. The maximum temperature reached in the autoclave is 150° C. The resulting panel is free of bubbles or heterogeneities.

EXAMPLE 3

A panel is made in the manner described in Example 1 except that the plasticizer is composed of benzyl and octyl adipate in an amount of 34 parts by weight per 100 parts by weight of resin. The resulting panel has no bubbles or heterogeneities.

EXAMPLE 4

On a heated glass sheet is glued, by pressing under the rolls of a calender, a sheet of polyvinylbutyral, 0.5 mm thick, plasticized by means of 41 parts by weight of triethylene glycol di-(ethyl-2-butyrate) per 100 parts by weight of resin. On this layer are placed using the same device as in Example 1, interconnected silicon photoelectric cells, after which there is made to fall through a screen, a powder mixture of 100 parts by weight of polyvinylbutyralresin and 41 parts by weight of plasticizer made up of triethylene glycol di-(ethyl-2-butyrate), to form a 3 mm thick layer. A glass sheet is placed on the polybutyral resin layer, and the unit is then put in a flexible bag and treated in an autoclave as in Example 1. As in the preceding Examples, the panel as seen by transmitted light, exhibits no bubbles or heterogeneities.

EXAMPLE 5

One of the rigid transparent sheets is covered with a layer of a mixture in powder state of thermoplastic encasing material and plasticizer, then interconnected photocells are placed and buried in this layer until their upper surface goes below the level of the upper surface of this layer. Then the second rigid transparent sheet is placed directly on the photocells without addition of a second layer of thermoplastic encasing material and plasticizer. Under its own weight and with a slight pressure, the second sheet crushes the little mounds of powder sticking up between the photocells and spreads them to form a layer of constant thickness.

EXAMPLE 6

Depending on the size of the cells, it is also possible to proceed as in Example 5, but without prior embedment of the photocells in the powder layer, and by covering their upper surface with a sheet of plasticized thermoplastic encasing material on which the second rigid, transparent sheet is placed.

EXAMPLE 7

A panel having improved fluid tightness is formed according to any one of Examples 1 to 4. The four sides on the periphery of this panel are covered with a mold, and a silicone resin sold under the trademark "RTV" by Rhone-Poulenc is injected into this mold under pressure. In the example considered, this mold is of polymethyl methacrylate. After polymerization of the silicone resin in the mold, the seal formed covers the edge of the panel.

The invention also encompasses the use of different additives in the plasticized polyvinylbutyral powder. These additives comprise stabilizers, anti-ultraviolet agents, adherence modifiers, and the like.

EXAMPLE 8

In this Example there is placed on a first glass sheet a sheet of polyvinylbutyral, 0.5 mm thick, plasticized with 41 parts by weight of triethyleneglycol di-(ethyl-2-butyrate) per 100 parts by weight of resin. The photocells are placed on this polyvinylbutyral sheet. A layer of polyvinylbutyral powder, plasticized as in the preceding sheet, is spread between the photocells and on them. A sheet of plasticized polyvinylbutyral like the first sheet and of the same 0.5 mm thickness is placed on the powder layer. Finally, a glass sheet is placed on this second sheet. The panel thus prepared is sheathed in a flexible bag and the whole unit is put in an autoclave where it is treated as in Example 1.

After removal of the panel from the autoclave and bag, said panel of solar photocells does not exhibit, by transparency, either bubbles or heterogeneities.

EXAMPLE 9

If photocells thicker than regular photocells are to be used, or if it is desired to obtain between the active upper face of the photocells and the upper transparent rigid sheet, after treatment of the panel in the autoclave, a layer of polyvinylbutyral of very equal thickness, the following procedure is desirably followed:

On the first rigid sheet, transparent or not, is placed a polyvinylbutyral film, followed by interconnected photocells 0.8 mm thick. On each of these is placed a mask capable of being removed easily after pulling the powdered polyvinylbutyral in place.

The system of pneumatic pickup of the photocells described in Example 1 can be left in place on the latter during spreading of the polyvinylbutyral powder if such a system allows this spreading and can be removed without disturbing the layer. Tests were also made by placing on the upper face of each photocell a mask made of an aluminum disc about 1.5 mm thick, and of the same surface as that of the photocell. Each disc comprises a more or less vertical rod of sufficient height to go beyond the height that the polyvinylbutyral layer exhibits after being put on the upper face of the photocells. After this layer has been put in place, the group of masks is removed by their rods by any suitable means. After depositing of the powder between the cells and on the masks and removal of these latter, a new layer of polyvinylbutyral is laid down which covers the cells. Then a rigid, transparent sheet such as glass is laid down. The panel thus prepared is, as in Example 1, introduced into a flexible bag connected to the vacuum, the entire unit being put into an autoclave to undergo hot gluing treatment under pressure as described hereinabove.

The prior presence of the masks makes it possible to avoid excess thicknesses of the polyvinylbutyral powder on any of the photocells. These excess thicknesses increase the risk, during hot treatment under pressure in the autoclave, of breaks or cracks in the photocells covered with an excess thickness of polyvinylbutyral powder in relation to the other photocells.

Naturally, the invention is not limited to the above embodiments which have been given only by way of example.

Figure 5:
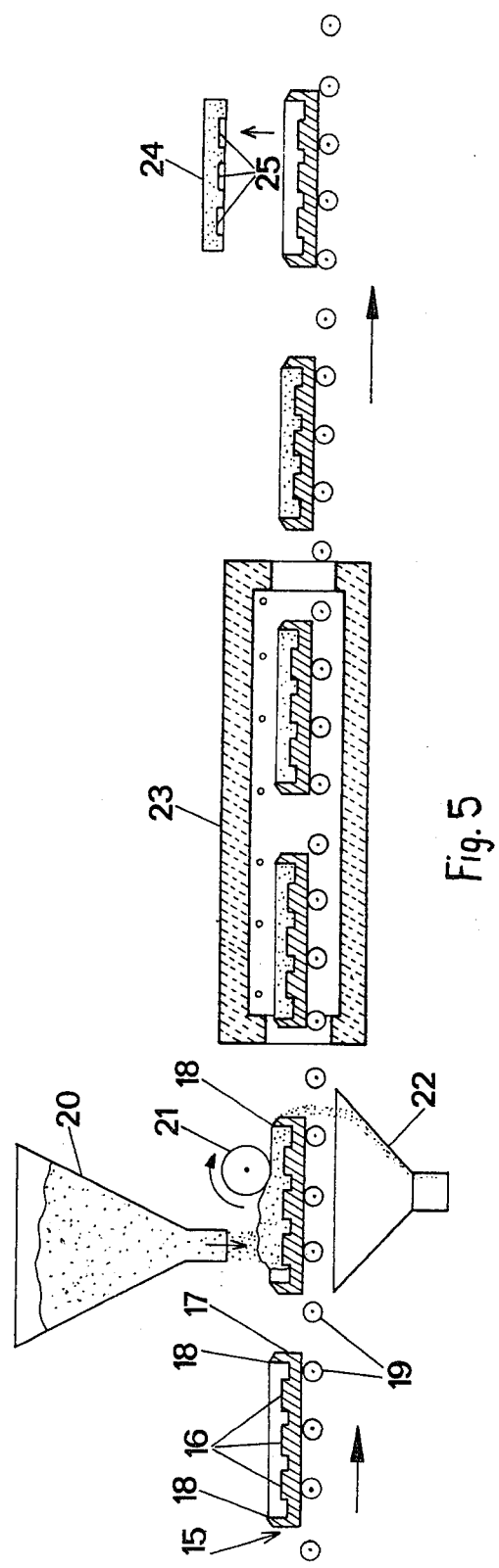
FIG. 5 is a longitudinal cross-section of a partially schematic installation for making the preform.

In a variant of the process according to the invention a preform of sintered powder is used to avoid variations in the thickness of the layer of thermoplastic resin powder. With reference to FIG. 5, the preform is made by means of a mold 15 in the shape of a flat dish, opened upward. The mold has a flat bottom on which rigid elements 16 of the same shape and approximately the same size as those of the photocells can be fastened or come from fabrication at spots corresponding to those of the photocells in the network to be encased.

Side walls 17 of the mold are orthogonal in relation to the bottom and end at their upper rim in sharp edges 18, all located in the same plane parallel to that of the bottom. The cavity of the mold is covered with a suitable anti-adhesive coating.

The process of making photocell panels by means of preforms will be described in the following examples.

EXAMPLE 10

A mold 15 is placed, with its cavity turned upward, on a conveyor, such as a horizontal roller conveyor 19, which brings it to a distributor 20 of the thermoplastic resin in the powder state. Polyvinylbutyral resin plasticized with benzyl and octyl adipate is used in an amount of 34 parts of plasticizer per 100 parts by weight of resin. The mold is carried at a speed of 0.4 meter per minute under the distributor which delivers the plasticized powder at a rate of 1,000 grams per square meter.

The mold, filled with an excess of powder, is then directed by the conveyor to a station comprising a smooth calendering roll 21, rotating around a driven horizontal shaft. The roll is regulated in height so as to be flush with the sharp edges 18 of the mold, so that as the mold passes under the roll, the excess powder is eliminated and the upper face of the preform is made plane. Further, the edges of the preform are cut cleanly at the level of the sharp edges 18. The excess powder is collected in a collecting container 22.

The conveyor then introduces the filled mold into a tunnel oven 23 heated to a temperature of 50° C. Sintering of the plasticized polyvinylbutyral is obtained after the mold stays 10 minutes in the oven.

On leaving the oven, preform 24 of fritted powder is taken from the mold; one of its faces comprises imprints 25 ready to receive photocells 0.3 mm thick, that have been preconnected. The height of the preform can equal about 5 mm and that of the imprints 1.5 mm.

The preform 24 is placed on the lower rigid sheet, with the imprints turned upward, and the network of interconnected photocells is introduced into the imprints. Then this unit is covered with a sheet of polyvinylbutyral plasticized in the same proportions with benzyl and octyl adipate having a thickness of about 0.5 mm. The unit is then covered with the upper rigid sheet and the resulting sandwich is treated under the same conditions as in Example 1.

EXAMPLE 11

The procedure of Example 10 is repeated, except that the 0.5 mm thick polyvinylbutyral sheet is replaced with a 2.5 mm thick preform whose faces do not have imprints.

A photocell panel free of bubbles and heterogeneities is obtained.

EXAMPLE 12

As in Example 1, a photocell network, placed on a first layer of plasticized polyvinylbutyral powder applied to the bottom of the mold cavity, is covered with a second layer of plasticized powder whose surface is smoothed. Then the mold is put in a tunnel oven heated to 50° C., the dwell time in the oven being 15 minutes. In this way a 10 mm thick fritted or sintered preform encasing the photocell network is obtained. The panel is completed by assembling between two glass sheets wherein the one placed above is a pellicular film having a thickness of 0.3 mm.

EXAMPLE 13

The procedure in Example 10 is repeated but by using unplasticized polyvinylbutyral powder which is preformed and introduced for 15 minutes in a tunnel oven heated to a temperature of 170° C. The resulting preform is assembled with other elements of the solar preform as in the preceding Examples.

EXAMPLE 14

In the particular case where it is desired to use photocells in a shape other than circular, for example, rectangular with rounded corners or in the shape of a crescent and overlapped in a fairly joined manner, the network of interconnected photocells is placed between a flat preform and a preform provided with a single imprint, fitting around the assembly of photocells.

EXAMPLE 15

The procedure of Example 10 is repeated except that acrylic polymer is used instead of glass plates to make the sandwich of rigid plates.

During prior treatment intended to improve adherence of the polyvinylbutyral resin to the face of the acrylic plate with which it is in contact in the sandwich, said face is treated (after first being washed with water to which detergent has been added and then rinsed and dried) with a solution applied by spraying or dipping and obtained from a 50/50 mixture by volume of absolute ethyl alcohol and 1,2-dichloroethane in which has been dissolved an acrylic adhesive assuring adherence of the polyvinylbutyral to the acrylic plate, the amount of dissolved adhesive assuring the resulting solution a viscosity of about 1,000 centipoises at 25° C. The treated face is then dried for 30 minutes at a temperature not exceeding 50° C.

During the assembly of the sandwich, care is taken to put the treated face of each acrylic plate in contact with the polyvinylbutyral resin; further, a 6 mm thick sheet of thermally tempered glass is placed on each untreated face of these plates. The sandwich thus constituted is placed in a vacuum pocket and fabrication of the solar panel is completed as described in Example 10.

The tempered glass sheets, which are easily separated from the finished panel, are intended to prevent possible deformations of the acrylic plates during passage of the sandwich in the autoclave.

EXAMPLE 16

Example 10 is reproduced by using an aluminum or aluminum alloy plate having a minumum thickness of 3 millimeters as the lower rigid plate.

The face of this plate, in contact with the polyvinylbutyral resin in the sandwich, must undergo a pretreatment that involves careful degreasing and drying followed by application (by spraying or dipping) of a primary coat of silicone (Y 4310 of Union Carbide) which is dried for a half hour at a temperature of 125°–130° C.

What is claimed is:

1. A process for producing a panel of a plurality of electrically connected photocells wherein each photocell has a lower face, a side face and a radiation receiving face, said process comprising:
    (a) embedding at least the lower faces and side faces of the photocells and their electrical connectors in a thermoplastic resin in particulate form, said resin becoming transparent upon fusion;
    (b) enclosing the photocells embedded in step (a) between two rigid sheets to form a sandwich-type assembly, with at least the rigid sheet enclosing the receiving faces of the photocells being optically transparent;
    (c) disposing the stacked assembly formed in step (b) within a flexible bag;
    (d) subjecting the interior of the flexible bag to a vacuum while applying relatively high pressure to the outside of the bag, and raising the temperature within the bag to fuse the thermoplastic resin particles; and
    (e) cooling the contents of the bag to solidify the resin and form thereby the panel comprising the photocells adhesively embedded in the solidfied resin between the rigid sheets, and restoring atmospheric pressure to the interior of the bag.

2. Process according to claim 1 comprising the additional step of placing a sheet of optically transparent thermoplastic material between the photocells embedded in the resin in step (a) and the rigid sheet enclosing the receiving faces of the photocells in step (b), said sheet of thermoplastic material being capable of adhesively bonding to the resin and to said rigid sheet.

3. A process according to claim 1 wherein the photocells and their electrical connectors are completely embedded in said particulate resin in step (a).

4. A process according to claim 1 wherein:
    one of the rigid sheets is covered with a layer of the particulate thermoplastic resin;
    the receiving faces of the photocells are covered with a sheet of optically transparent thermoplastic material which is capable of adhesively bonding to the resin and to the second rigid sheet.

5. A process according to claim 1, 2, 3 or 4 comprising the additional steps of charging the particulate thermoplastic resin to a preforming mold having reliefs intended to reproduce imprints of said photocells; leveling the upper surface of the particulate resin; heating the mold thus charged to the sintering temperature of the particulate resin; removing the resulting sintered resin preform from the mold; placing said preform on one of the rigid sheets with the imprints turned upward; embedding the photocells in the imprints; and applying the second rigid sheet to form the sandwich-type assembly.

6. A process according to claim 5 wherein, after the photocells are encased in the imprints, the sintered resin preform is covered with a second sintered preform having no imprints, and to which is applied the second rigid sheet to form the stacked assembly.

7. A process according to claim 6 wherein the first sintered preform has a single imprint adapted to encase the electrically connected photocells.

8. A process according to claim 1, 2, 3 or 4 wherein the rigid sheet enclosing the receiving face of the photocells is an optically transparent glass sheet.

9. A process according to claim 1, 2, 3 or 4 wherein the particulate thermoplastic resin in step (a) is polyvinylbutyral resin.

10. A process according to claim 1, 2, 3 or 4 wherein the particulate thermoplastic resin in step (a) includes a plasticizer.

11. A panel of a plurality of electrically connected photocells wherein each photocell has a lower face, a side face and a radiation receiving face, said panel being produced by (a) embedding at least the lower faces and side faces of the photocells and their electrical connectors in a thermoplastic resin in particulate form, said resin becoming transparent upon fusion;

(b) enclosing the photocells embedded in step (a) between two rigid sheets to form a sandwich-type assembly, with at least the rigid sheet enclosing the receiving faces of the photocells being optically transparent;

(c) disposing the stacked assembly formed in step (b) within a flexible bag;

(d) subjecting the interior of the flexible bag to a vacuum while applying relatively high pressure to the outside of the bag, and raising the temperature within the bag to fuse the thermoplastic resin particles;

(e) cooling the contents of the bag to solidify the resin and form thereby the panel comprising the photocells adhesively embedded in the solidified resin between the rigid sheets, and restoring atmospheric pressure to the interior of the bag.

* * * * *